United States Patent [19]

Manning et al.

[11] Patent Number: 5,742,415
[45] Date of Patent: Apr. 21, 1998

[54] OPTICAL SWITCHING DEVICE

[75] Inventors: Robert J. Manning, Ipswich; David M. Spirit, Woodbridge; David M. Patrick, Colchester; Andrew D. Ellis, Ipswich, all of Great Britain

[73] Assignee: British Telecommunications public limited company, London, England

[21] Appl. No.: 624,523

[22] PCT Filed: Oct. 11, 1994

[86] PCT No.: PCT/GB94/02240

§ 371 Date: May 28, 1996

§ 102(e) Date: May 28, 1996

[87] PCT Pub. No.: WO95/10795

PCT Pub. Date: Apr. 20, 1995

[30] Foreign Application Priority Data

| Oct. 11, 1993 | [EP] | European Pat. Off. | 93308066 |
| Oct. 11, 1993 | [EP] | European Pat. Off. | 93308067 |
| Jan. 26, 1994 | [GB] | United Kingdom | 9401463 |
| Jan. 27, 1994 | [GB] | United Kingdom | 9401558 |

[51] Int. Cl.⁶ .................................................. H04J 14/02
[52] U.S. Cl. ........................ 359/128; 359/158; 359/139
[58] Field of Search .................................. 359/128, 138, 359/139, 158, 160, 162

[56] References Cited

U.S. PATENT DOCUMENTS

| 5,357,359 | 10/1994 | Uchiyama et al. | 359/138 |
| 5,369,520 | 11/1994 | Avramopoulos | 359/139 |
| 5,444,560 | 8/1995 | Bernsley | 359/138 |
| 5,548,433 | 8/1996 | Smith | 359/158 |
| 5,592,319 | 1/1997 | Lee et al. | 359/128 |

*Primary Examiner*—Kinfe-Michael Negash
*Attorney, Agent, or Firm*—Nixon & Vanderhye P.C.

[57] ABSTRACT

A non-linear optical switch includes a semiconductor optical gain medium. The switch is arranged to switch a signal at a first wavelength in response to a control signal at a second wavelength applied to the optical gain medium. The refractive index of the gain medium is modified in response to the control signal. An optical holding signal at a third wavelength is applied to the gain medium. The optical holding signal pumps the optical gain medium and thereby fixes the Fermi level. The switch may be embodied in OTDM demultiplexers, clock recovery circuits, wavelength converters and other devices.

15 Claims, 6 Drawing Sheets

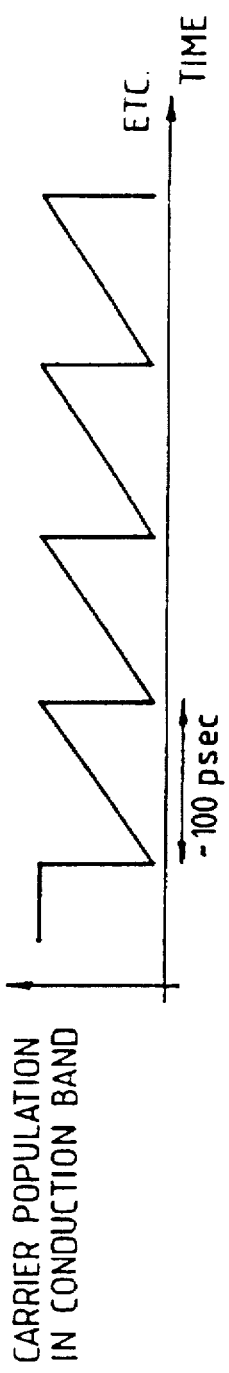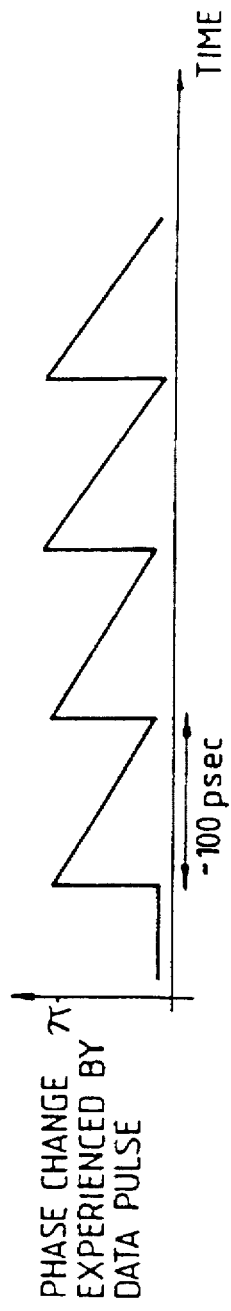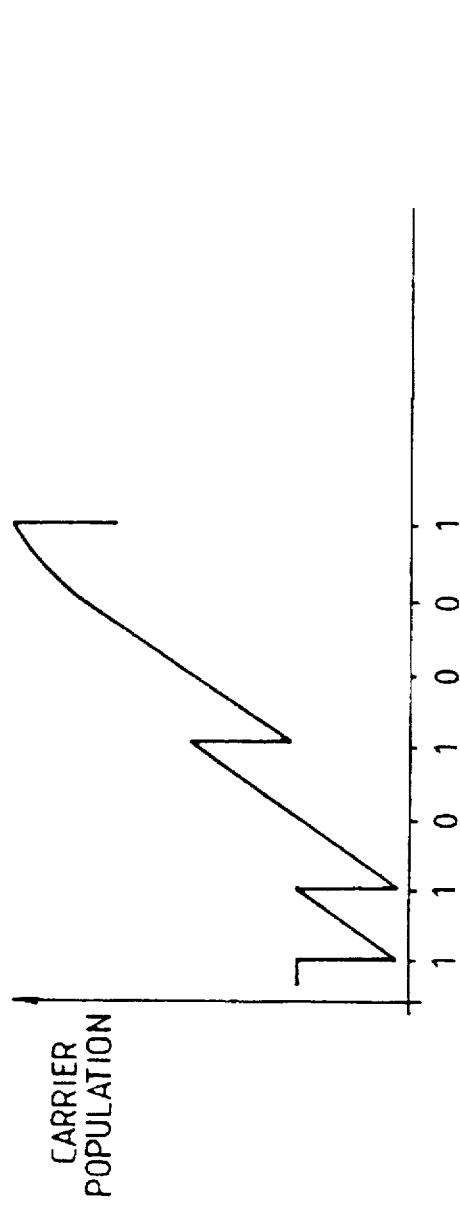

| | | | |
|---|---|---|---|
| CH. 3 | = 20.00 mVOLTS/DIV | OFFSET | = 95.00 mVOLTS |
| TIMEBASE | = 100 ps/DIV | DELAY | = 16.5000 ns |
| ● DELTA V | = 0.0000 VOLTS | | |
| ● V MARKER 1 | = 85.000 mVOLTS | V MARKER 2 | = 85.000 mVOLTS |
| ● DELTA T | = -41.6 ps | | |
| ● START | = 16.3428 ns | STOP | = 16.3012 ns |

TRIGGER ON EXTERNAL AT POS. EDGE AT 34.00 mVOLTS

OPTICAL SWITCHING DEVICE

BACKGROUND TO THE INVENTION

The present invention relates to a non-linear optical switch, and in particular to a switch incorporating a semiconductor optical gain medium which imposes a switchable phase change on an optical signal, and to optical circuits incorporating such a switch.

Non-linear optical switches of the type the present invention is concerned with, are potentially of use in a wide variety of fields. For example, in optical telecommunications systems, such switches may form the core of a demultiplexer for use with an OTDM (optical time division multiplexing) pulse stream. A demultiplexer using a semiconductor non-linear element in a non-linear loop mirror configuration can operate at bit rates as high as 10 GHz. Also in the field of optical telecommunications systems, the use of semiconductor non-linear elements has been proposed for clock-recovery. Our co-pending International application PCT/GB 93/00863 discloses and claims such clock-recovery circuits incorporating non-linear elements in the cavity of a mode-locked laser system.

Hitherto, using conventional semiconductor non-linear elements, the performance of such optical switches has been limited significantly by the recovery time of the semiconductor optical gain medium. High electrical bias fields have been used with the semiconductor laser medium to maximise the recovery speed, but even so for some applications, such as clock recovery, it has still not proved possible to obtain the recovery times necessary for operation at the highest data rates.

SUMMARY OF THE INVENTION

According to a first aspect of the present invention there is provided a non-linear optical phase switch including a semiconductor optical gain medium arranged to switch a signal at a first wavelength ($\lambda_3$) in response to a control signal at a second wavelength ($\lambda_2$) applied to the optical gain medium, the refractive index of the gain medium being modified in response to the control signal, characterised by means for applying an optical holding signal at a third wavelength ($\lambda_1$) to the gain medium, the optical holding signal pumping the semiconductor optical gain medium thereby fixing the Fermi level of the gain medium.

The present invention uses a third light beam applied to the semiconductor gain medium to provide a non-linear switching element with a reduced recovery time, and a recovery time which moreover can be controlled directly simply by varying the intensity of the holding beam. The holding beam, by clamping the Fermi level of the conduction band in the gain medium, ensures that the response of the non-linear switching element to the control signal is uniform, even where the control signal itself is irregular. This is of particular significance in clock-recovery applications, where the control signal is a data stream which may, for example, include a long sequence of zeros.

The system may be operated with wavelength-degeneracy, that is to say the wavelength of the holding beam may be equal to one or both of the other wavelengths. However it is much preferred that the three wavelengths should all be different. This makes possible optimisation of the performance of the device by selecting suitable wavelengths in accordance with the wavelength-gain characteristic of the amplifier. It also makes possible separation of the different beams using, for example, WDM couplers.

There are few restrictions on the wavelengths which may be selected for the signal $\lambda_3$. The closer it is to the band-gap equivalent wavelength, the better the phase modulation, the nearer it is to the holding beam the better the amplitude modulation. It may also be placed above the holding beam energy (i.e. in loss)—this was the case in recent successful clock recovery experiments at 10 and 20 GHz. A further alternative possible position for the signal wavelength is below the band-gap energy of the semiconductor material. The signal is then in transparency.

The optical holding signal may be a continuous wave (cw) signal, or alternatively may be a pulsed signal timed to follow (that is come after in the time domain) the control signal.

Preferably the switch comprises a non-linear loop mirror (NOLM) incorporating a semiconductor laser amplifier (SLA) as its non-linear element. As further discussed below, such a switch is particularly suitable for use as an OTDM demultiplexer, and may then use a TOAD [2] configuration.

Although the present invention has been found to be particularly effective in NOLMs, it may also be used with other switching structures. For example, the semiconductor optical gain medium may be arranged in one arm of a Mach Zender interferometer. This may be formed as an integrated solid state device. Such a configuration provides enhanced time resolution, since the response of the switch is no longer limited by the transit time through an optical loop as in the NOLM configuration.

Optical switches embodying the present invention may be used in OTDM demultiplexers, as described, for example, in 'The use of GaInAsP amplifiers for 40 Gbit/s signal processing' A. D. Ellis, D. M. Spirit Postdeadline Paper, Non-linear Guided-Wave Phenomena, Cambridge, England Sep. 20–22, 1993.

Preferably a relatively high electrical bias is applied to the semiconductor gain medium such that the holding beam experiences gain sufficient at least substantially to eliminate attenuation of the holding beam on its passage through the amplifier. More preferably the holding beam has a relatively low launch power such that it does not saturate the gain medium immediately on entry to the medium, and the semiconductor is electrically biased to provide net gain to the holding beam.

The present inventor has found that the electrical bias applied to the amplifier has a significant effect on the recovery rate, and that this rate can be optimised by increasing the electrical bias to a level where the gain experienced by the holding beam is at least sufficient to counteract the attenuation which would otherwise be experienced by the holding beam. In this manner, the optical input power required for the holding beam can be made relatively small, most of the power for the holding beam being provided by gain within the amplifier in response to the applied electrical power.

Optical switches embodying the present invention may be used in clock recovery and/or signal regeneration circuits as described and claimed in our pending International application PCT/GB 93/00863 filed 26th Apr. 1993. They may also be used in optical pulse generator circuits, as described and claimed in our co-pending International application entitled "Optical Switch", (Agent's Ref 80/4633/02) claiming priority from EP 93308067.3. The present invention is however by no means limited to use in these fields, and may be used wherever an optical switching element of enhanced and readily controllable recovery time is required.

According to a second aspect of the present invention there is provided an OTDM demultiplexer including a switch.

According to a third aspect of the present invention there is provided an optical pulse generator comprising a switch according to the first aspect connected in the optical cavity of a mode-locked laser, in use the control signal applied to the gain medium cross-phase modulating pulses propagating in the cavity.

According to a fourth aspect of the present invention there is provided a method of switching an optical signal comprising directing an optical signal at a first wavelength through a semiconductor gain medium and modifying the refractive index of the gain medium in response to a control signal at a second wavelength, characterised by applying an optical signal at a third wavelength to the gain medium, thereby pumping the medium.

BRIEF DESCRIPTION OF THE DRAWINGS

Embodiments of the present invention will now be described, by way of example only, with reference to the accompanying drawings in which:

FIGS. 4a–4c show the variation with time of the carrier population and phase of the semiconductor of FIG. 3 for a regular clock stream;

DESCRIPTION OF EXAMPLES

Figure 1:
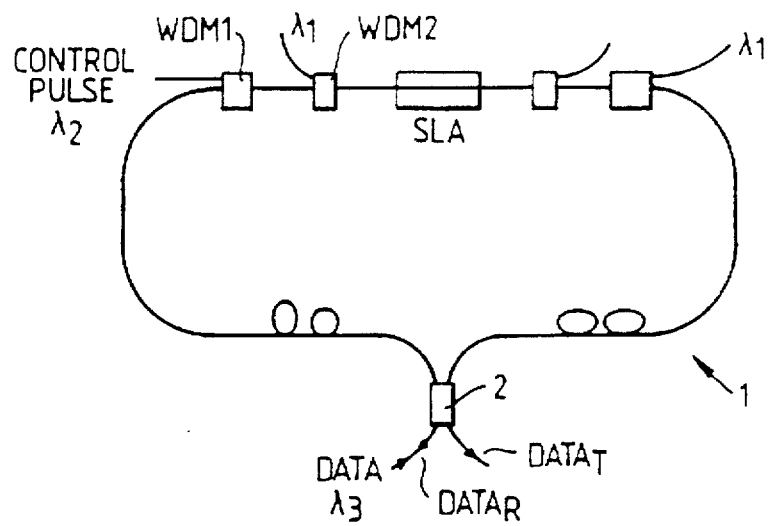
FIG. 1 is a diagram illustrating a demultiplexer incorporating the switch of the present inventions.

FIG. 1 shows a first system embodying the present invention. A non-linear loop mirror (NOLM) configured to operate as a demultiplexer includes a semiconductor laser amplifier (SLA) as the non-linear element in the loop. The loop functions in a conventional fashion, with data input via a coupler 2 being either transmitted (T) or reflected (R) depending upon the phase change it experiences within the loop. That phase change is determined by the state of the semiconductor laser amplifier. The state of the amplifier is switched in response to an input control signal at a wavelength $\lambda_2$. This control signal is coupled into the loop via a wavelength division multiplexer WDM1.

In the system embodying the present invention, a further signal, the holding signal at wavelength $\lambda_1$ is coupled into the semiconductor laser amplifier via a second wavelength division multiplexer WDM2. As further described below, this has the effect of optically biasing the semiconductor laser amplifier so as to reduce its recovery time after the application of each control pulse from the pulse source. This enables the demultiplexer to function at an increased bit rate.

Figure 2:
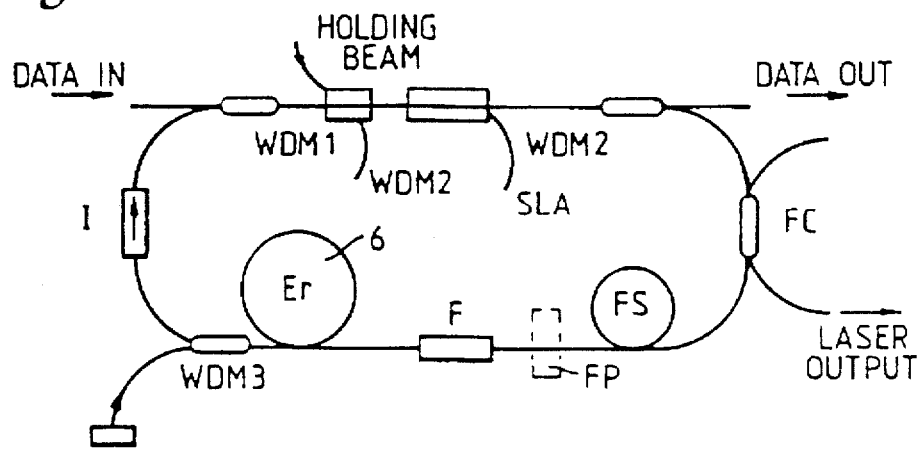
FIG. 2 shows a clock recovery circuit incorporating the switch of the present invention.

FIG. 2 shows a second embodiment of the present invention. In this case, the circuit is a clock-recovery circuit of the type described in our above-cited co-pending International application PCT/GB93/00863. The semiconductor laser amplifier in this case acts as a modulator connected in the optical cavity of a ring-laser. The "control signal" in this case is a data stream applied to the semiconductor laser. Cross-phase modulation and amplitude modulation of the applied data stream and the pulses in the laser cavity results in the generation within the cavity of a pulse train locked to the timing waveform of the data stream. This pulse train is coupled out of the cavity to provide a clock for subsequent optical processing stages. As in the first circuit described above, when the present invention is applied in this context, an additional optical signal provided by the holding beam at wavelength $\lambda_1$ is applied to the semiconductor laser amplifier. As above, this biases the amplifier to speed the recovery time and also, crucially in this particular application, fixes the Fermi level of the semiconductor gain medium in such a way as to ensure that:

(1) there is a constant phase response to the applied modulating signal;

(2) The phase does not change in the absence of a signal (i.e. an absence corresponding to a 0).

These effects are of value where data streams are to be used as the "clock" stream ($\lambda_2$), for optical processing with this device, whatever the specific application (e.g. wavelength conversion, demultiplexing, etc.).

In a circuit as described above for use in clock recovery, if the data stream is a repetitive signal having a repeat period equal to or an integer multiple of the cavity round trip time, then rather than outputting a uniform clock it produces a pulse stream having bits in bit-positions corresponding to those channels in the repetitive signal which carry data, and no bits in positions corresponding to those channels in the signal which are OFF, i.e. permanently set to zero. As described and claimed in our co-pending International application (agent's reference 80/4633/03), the circuit then functions as a programmable pulse generator which replicates the input signal pattern and may be used, for example, in controlling an all-optical demultiplexer in which the output of the pulse generator gates an optical switch such as an NOLM.

Figure 3:
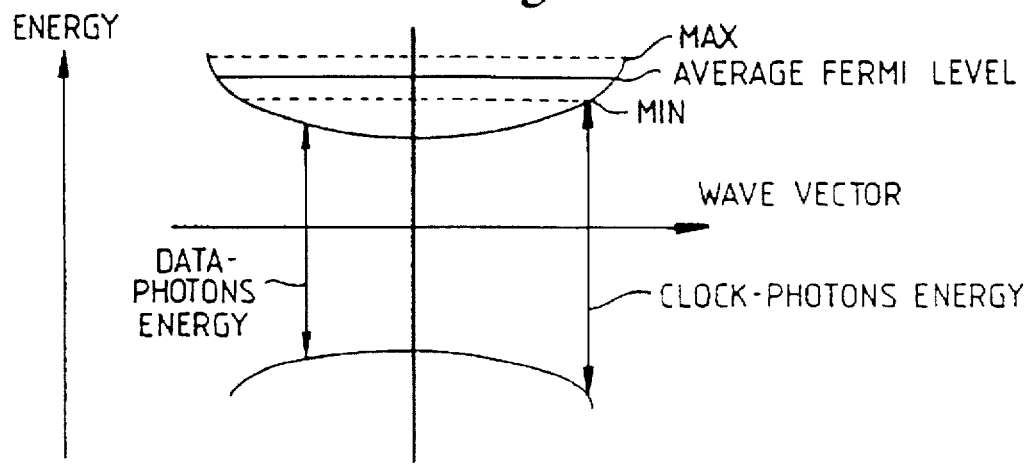
FIG. 3 is a diagram illustrating the energy levels of a prior art semiconductor laser.

FIG. 3 illustrates the energy levels of a conventional semiconductor laser amplifier. Such amplifiers as used hitherto for switching applications have received signals at just two wavelengths, the signal wavelength (for example the wavelength of the data in a demultiplexer) and a clock or control signal at a second wavelength. In the example of the circuit disclosed in [1] the clock is at a pulse rate of 10 GHz. A high electrical bias field is applied to the semiconductor to provide a recovery time on a time scale of approximately 100 psec. The clock pulse maintains the Fermi level at an average energy about which it fluctuates. The Fermi level is forced down as the clock saturates the gain, and then recovers (after the clock pulse has left) via electron and hole injection into the conduction and valence bands under the influence of the bias field. The carrier (electron and hole) population is then swept out again by the next clock pulse. The carrier population redistribution caused by the clock pulse is responsible for the $\pi$ phase shift experienced by the signal pulse. The fact that the Fermi level returns to the same position is due to the regular nature of the clock signal. The carrier population and phase change at the signal wavelength are shown in FIGS. 4a and 4b. The sign of the nonlinearity (or phase change) may be either positive or negative, depending upon the specific wavelengths selected for the three beams.

In clock recovery applications, a non-regular datastream replaces the clock and the Fermi level is no longer pinned as before since there is not necessarily a regular pulse at the bit-rate. For example, a data sequence of 1101001 would give the carrier population change shown in FIG. 4c. As seen in this Figure, the change in response to the 1's may not be constant and there is a time-varying phase change for the 0's.

Figure 5:
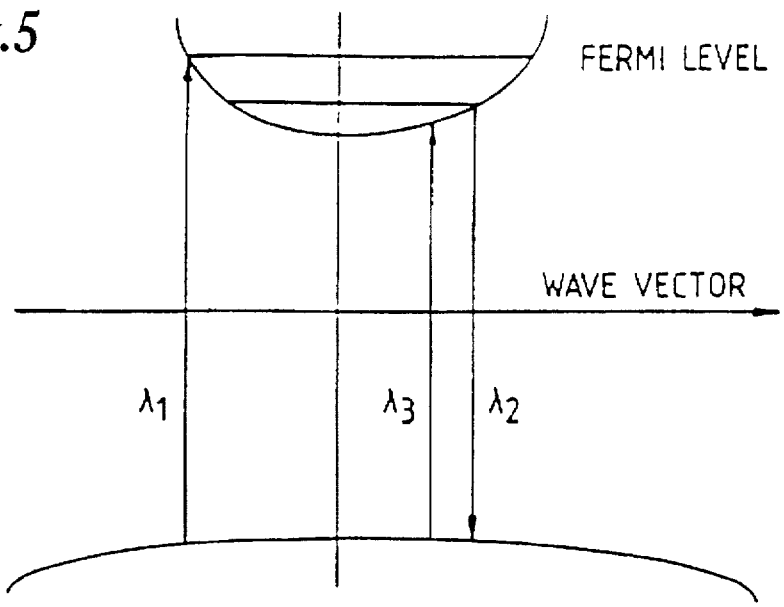
FIG. 5 is an energy level diagram for a switch embodying the present invention.
Figure 6:
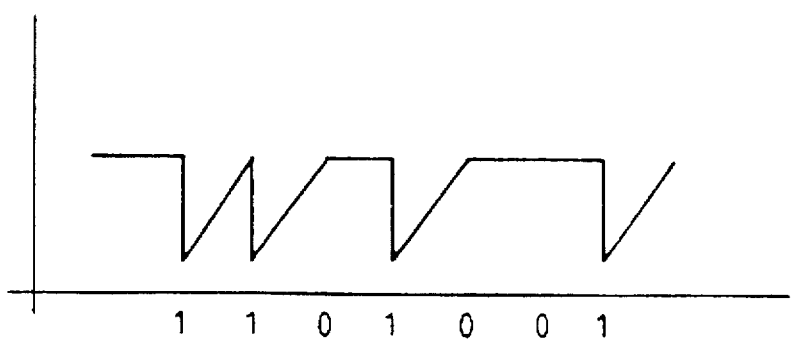
FIG. 6 shows the population change as a function of time for the clock recovery circuit of FIG. 2.

As already described, in the systems embodying the present invention the signal and control wavelengths supplied to the semiconductor are supplemented by a holding beam at a third wavelength. FIG. 5 shows the energy level diagram for the semiconductor in these circumstances. Now the Fermi level is clamped most of the time by the holding beam at wavelength $\lambda_1$. When a clock or control pulse arrives, the excess population of carriers is swept out causing a change in the refractive index at $\lambda_3$. The carrier population in the ground state is now pumped back by the continuous wave holding beam, very quickly if the beam is sufficiently intense. Thus the laser amplifier rapidly recovers its initial state. in the absence of a clock pulse, the gain is still clamped to the same value by the presence of the holding beam. The population change for a clock recovery circuit receiving the data sequence 1101001 now takes the form shown in FIG. 6. By contrast with the prior art, the phase does not now vary when 0's are present and the phase change on arrival of the next "clock" (driving) pulse is constant. Also, most importantly, the gain recovery rate is increased due to the presence of the optical bias which pumps carriers which have been stimulated down into the valence band back into the conduction band. The rate of recovery is directly proportional to the intensity of the optical bias supplied by the holding beam. It is important that this rate of recovery should be slower than the rate of population increase in the valence band due to the clock pulse, otherwise no significant population change or phase change would occur. However, in a typical data stream, there is 1:10 mark to space ratio, so that it is only necessary to ensure that recovery takes place on the time scale of the bit period, not on the time scale of the clock pulse. For example, for a 10 Gbit clock rate, the optical pulse is 10 psec and the bit period is 100 psec: the recovery has to be on the time scale then of 100 psec. This is convenient, since the rate of removal of carriers when the clock pulse is on will not be large (1/10 of the rate of injection of carriers into the valence band).

Figure 7:
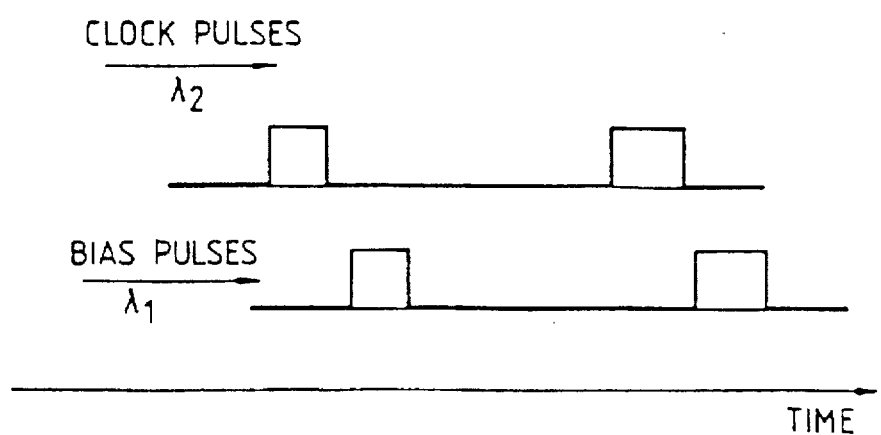
FIG. 7 is a timing diagram for a pulsed holding beam.

As an alternative to using a continuous wave holding beam, the beam maybe pulsed so that the gain is only replenished after the clock or control pulse has gone, as shown in FIG. 7.

The optical bias provided by the holding beam maybe used in place of electrical bias or in addition to electrical bias. The electrical bias is useful; it aids the recovery rate and supplies energy to the device, and for the embodiments discussed below provide one of the operating parameters. For the preferred embodiments, high bias currents (~200 mA) are desirable.

The approach adopted in the present invention gives the potential for extremely compact devices. The SLA may be pumped from one side at either the clock or holding beam wavelength using another laser or a surface emitting laser. The SLA maybe any semiconductor laser structure such as a bulk or quantum well, or a quantum wire (even quantum dot) device.

Although in the first example described above, the holding wavelength is shorter than that of either the wavelength of the control signal or the wavelength of the data carrying signal, the wavelengths maybe assigned differently. For example, in clock recovery, it may be advantageous to use the longer wavelength $\lambda_2$ for the bias or holding beam, and the shortest wavelength $\lambda_1$ for the data stream. Then the data stream adds to the gain of the system. This selection of wavelengths has the advantage that any amplitude modulation caused by the data pulses tends to be such as to add to the gain of the recovered clock pulses thereby providing a "shutter" effect. The excess gain is now swept out by stimulated emission at the holding beam wavelength. This arrangement reverses the sign of the refractive index change, which may be useful in the performance of the ring laser part of the clock recovery circuit.

The minimum wavelength separation between hold ($\lambda_1$) and clock ($\lambda_2$) is governed by the phase change needed for the specific application ($\pi$ for OTDM, $\pi/10$ or less for clock recovery), which sets the minimum carrier population change needed ($\sim 10^{17}$ cm$^{-3}$ for $\pi$). There must be at least this excess carrier population existing between the two wavelengths. The separation is therefore dependant upon a detailed knowledge of the band structure (its parabolicity or otherwise), and the density of states. The switching energy (for a $\pi$ phase change) is 3 picoJoules. Energies for a clock recovery circuit requiring a $\pi/10$ phase change are about 0.3 pJ. A recovery time of 10 ps requires about 300 mW of optical power for the OTDM embodiment.

The inventor conducted a series of measurements of the recovery rates of a semiconductor laser amplifier (SLA) with and without the intense optical cw "holding beam (referred to as $\lambda_1$ above) present in the amplifier and also investigated the effect of electrical bias on the recovery rate, with the holding beam on. These measurements gave amplitude and phase changes imparted on a weak "probe" pulse which passed through the amplifier after a stronger "excite" pulse had changed the properties of the SLA. The experiment hence gave time-resolved measurements of the recovery rates of the amplifier.

Figure 10A:
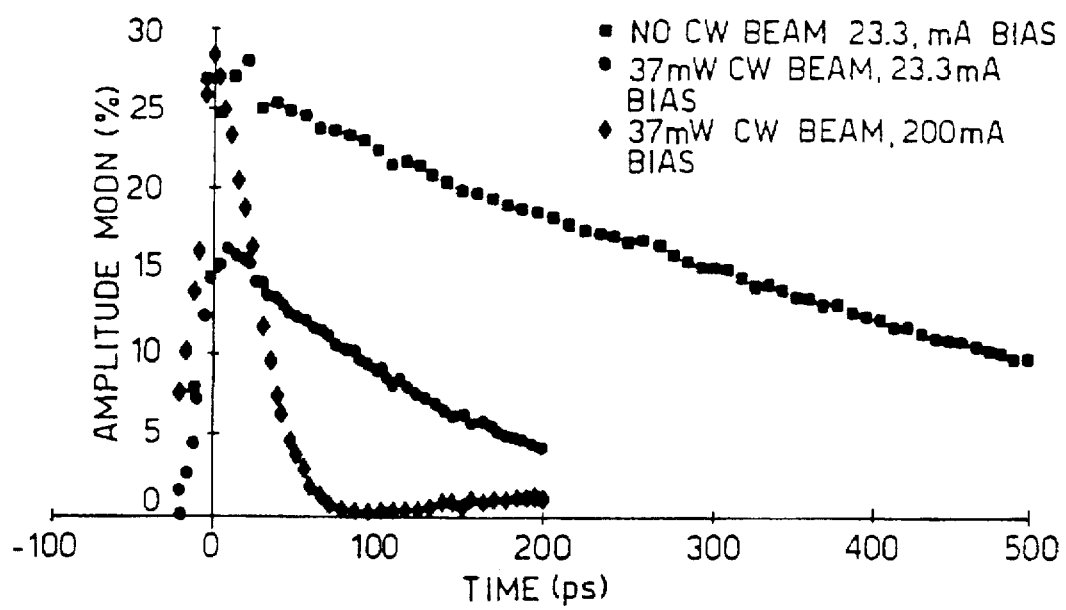
FIGS. 10a and 10b are plots of amplitude and phase modulation respectively for different applied bias currents.
Figure 10B:
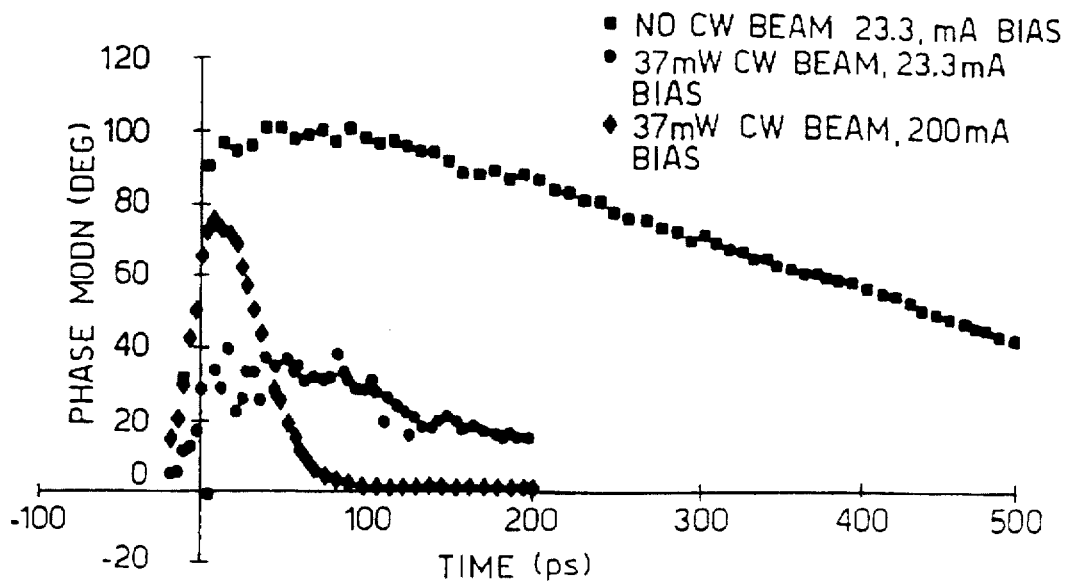

The power in the holding beam was ~37 mW in the fibre immediately before the amplifier. Assuming a 3 dB coupling loss, the power launched into the SLA was ~18 mW. The wavelength of the holding beam was 1535 nm. The "excite" and "probe" pulses correspond to the "clock" pulses ($\lambda_2$) and the "data" (or "signal") pulses ($\lambda_3$). In these experiments, the "excite" and "probe" pulses have the same wavelength, 1562 nm. The pulse duration was ~10 ps for both pulses, and the "excite" pulse energy was ~1.5 pJ (again measured in the fibre prior to launch into the SLA (hence a launched energy of ~0.7 pJ). The electrical bias was varied from ~20 mA to 200 mA, to observe the effect on recovery rate. The results of these experiments are in FIGS. 10a and 10b which give the amplitude and phase modulation (measured simultaneously). As may be seen, the effect of increasing the electrical bias is dramatic. The results are summarised in Table 1 below. Note that the (1/e) lifetimes were taken from straight line fits to log plots of the data.

TABLE 1

| CW Beam Power | Electrical bias current | Lifetime |
| --- | --- | --- |
| (mW) | (mA) | (ps) |
| 0 | 23.3 | 500 |
| 37 | 23.3 | 105 |
| 37 | 100.0 | ~45 |
| 37 | 199.9 | 13.2 |

Note that the 100 mA data is not shown in the figures.

Figure 11:
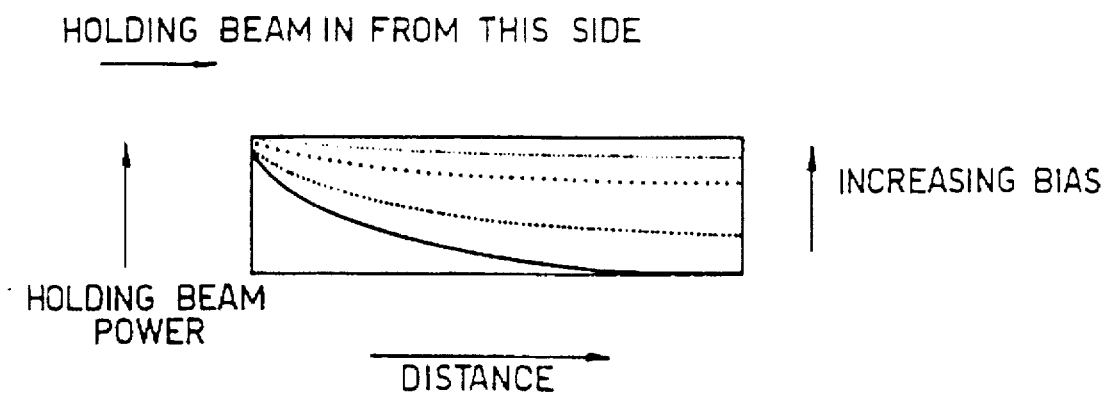
FIG. 11 shows optical power distribution along an SLA.

It is believed that the dramatic effect of increasing the bias current is mostly due to longitudinal effects in the amplifier. At low bias currents the cw beam saturates the available gain but experiences loss as it passes through the amplifier due to scattering losses. This loss was measured to be ~10 dB for a bias current of ~25 mA. At a bias of 200 mA the cw beam experiences almost no loss. Hence at low bias there is a 20 mW power only in the part of the front of the SLA. At high bias, there is uniform illumination throughout the length of the SLA. A schematic of this is given in FIG. 11. We conclude, therefore, that best (fastest) operation will be with high bias currents (200 mA or greater). This is important, since it reduces the need for excessively large holding beam powers, which are difficult to obtain practically. At high bias currents, there may be carrier number density effects which will decrease the lifetime in the absence of the holding beam, and may reduce the lifetime with the holding beam. Leakage effects may also decrease the lifetime.

In a further experiment by the inventor, still shorter lifetimes were obtained using a lower power holding beam, at powers in the launch fibre of 5–30 mW, with a bias current of 300 mA. The response lifetime was then less than or equal to the time resolution of the experimental system, i.e. $\leq 10$ ps. At these lower launch powers the holding beam does not saturate the gain of the semiconductor on entry and experiences greater amplification.

The SLA has a natural lifetime of about 1 ns and a length of approximately 0.5 mm. This length is much shorter than the length of the fibre modulators previously proposed for use in clock recovery circuits and so makes possible a very large reduction in latency, that is the time taken for the circuit to respond to an input signal and output a clock signal. The SLA is also able to offer broadband operation over the gain spectrum of the amplifier, typically a bandwidth of approximately 100 nm. The position in the energy diagram of the signal ($\lambda_3$) suffers few restrictions. The closer it is to the band gap equivalent wavelength, the better the pure FM operation (i.e. phase modulation), the nearer the holding beam, the better the AM modulation (i.e. amplitude modulation). It may also be placed above the holding beam energy (i.e. in loss)—this was the case in the recent successful clock recovery experiments at 10 and 20 GHz.

Figure 12:
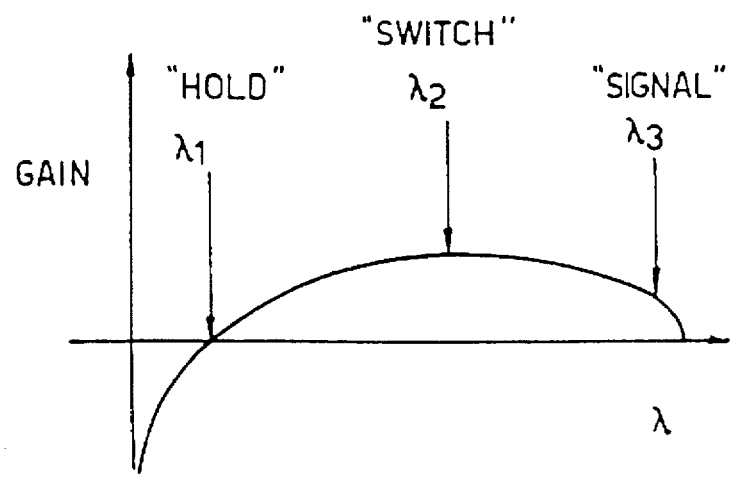
FIG. 12 shows optimum wavelengths for a phase modulation switch.

FIG. 12 plots gain as a function of wavelength (i.e. inverse energy). We assume a saturating beam at $\lambda_1$, within the gain bandwidth of the SLA. The "clock" or "control" pulse at $\lambda_2$ are preferably near the gain peak, since this minimises the pulse energy required for switching in the demultiplexing scheme or clock recovery, or other operation. The choice of value for the "signal" wavelength at $\lambda_3$ depends on the functionality required for the switch. For a large amplitude modulation, $\lambda_3$ should be near the short wavelength gain minimum (i.e. near the holding beam wavelength). If a small amplitude modulation is wanted, as is the case for demultiplexing, then $\lambda_3$ should be near the long wavelength gain minimum. The phase modulation should be approximately the same over the gain spectrum for $\lambda_3$. It is desirable to minimise the loss of the signal pulse ($\lambda_3$) as it passes through the SLA. Ideally a transparent switching device is needed. Hence some gain will be required at $\lambda_3$ to balance the launch loss at both ends of the SLA. This should be ~6 dB.

In experiments carried out by the inventor, of the required ~300 mW of optical power, 37 mW was supplied directly as the input power of the optical beam, and the remainder supplied through amplification of the beam in the amplifier, the amplifier consuming electrical power of around 450 mW.

Figure 8:
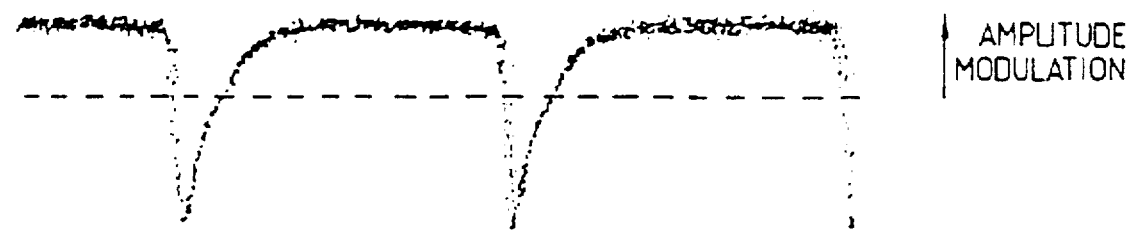
FIG. 8 is a graph showing the recovery time of the switch.

FIG. 8 shows further experimental results obtained using the circuit described above with reference to FIG. 2. For convenience, recovery in amplitude modulation rather than phase modulation is displayed. The recovery time is seen to be ~34 psec for a 100 mw holding beam. For NOLM applications such as demultiplexing it maybe useful to allow lasing at the optical bias wavelength since this will ensure pinning of the Fermi level. For clock recovery applications, the signal wavelength power (i.e. the recovered clock) should not be allowed to saturate the gain. Indeed, in all applications, the power in the signal beam ($\lambda_3$) should be small to avoid saturation at this wavelength. In a further example using the circuit of FIG. 2 for clock recovery, the data signal was at 1.5567 µm, at a bit rate of 10 Gbit/sec, power level +7.6 dBm, the recovered clock was at 1.544 µm, at 10 Gbit/s, and the CW Holding beam was at 1.5577 µm, at a power of +8.1 dBm. The power of the recovered clock was +1.2 dBm. The holding beam in this example is lower in energy, i.e. longer in wavelength, than the recovered clock ($\lambda_3$); hence the element runs in loss in that the recovered clock is in loss passing through the element. The data sequence used had a pattern length of $2^{31}-1$.

The semiconductor used for these embodiments is a polarisation insensitive bulk layer semiconductor laser amplifier GaAsInP device having a peak wavelength gain at 1.54 µm. It has a facet/facet gain of 22 dBm, a 1.2 dB TE/TM sensitivity and a +2 dBm saturated output power. Such a device is available commercially from BT & D/Hewlett Packard of Whitehouse Way, ipswich, U.K. as SOA 1100/SOA 3100.

As already noted, the use of the non-linear switching element of the present invention is not limited to the two fields of clock recovery and demultiplexing, but may find a variety of other uses. For example, the optical switch may form the basis of a logic element in signal processing applications and within the field of optical computing. The switch maybe used for very high speed switching (on-off) using both a pulsed bias and a clock beam. The switch might form the basis of an optical phase flip-flop element. The switch might form part of a wavelength converter using cross-phase modulation to effect a shift at the signal wavelength. In this case, again referring to FIG. 5, $\lambda$. is the holding beam, $\lambda_2$ is the clock and $\lambda_3$ is a cw signal. Cross-phase modulation of the $\lambda_2$ clock and $\lambda_3$ signal gives periodic shifts in the frequency of $\lambda_3$, and the shifted portions of $\lambda_3$ may subsequently be filtered out to give a wavelength-shifted data stream.

The OTDM and clock recovery circuits described above may be combined to give an all-optical signal regenerator as described in our above-cited co-pending International application. In this context it is again particularly advantageous to hold the Fermi level at a predetermined position.

Figure 9A:
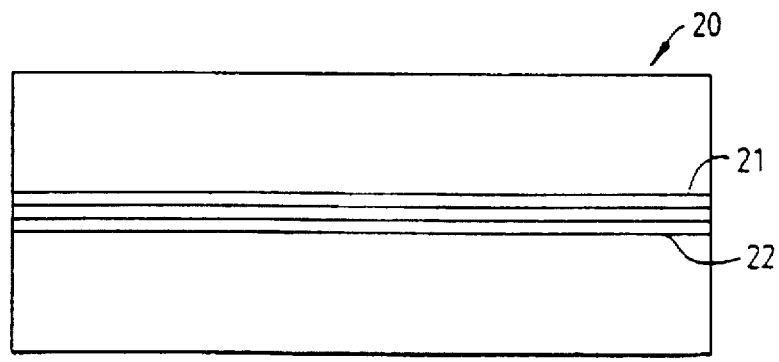
FIGS. 9a and 9b are views of an active waveguide device.
Figure 9B:
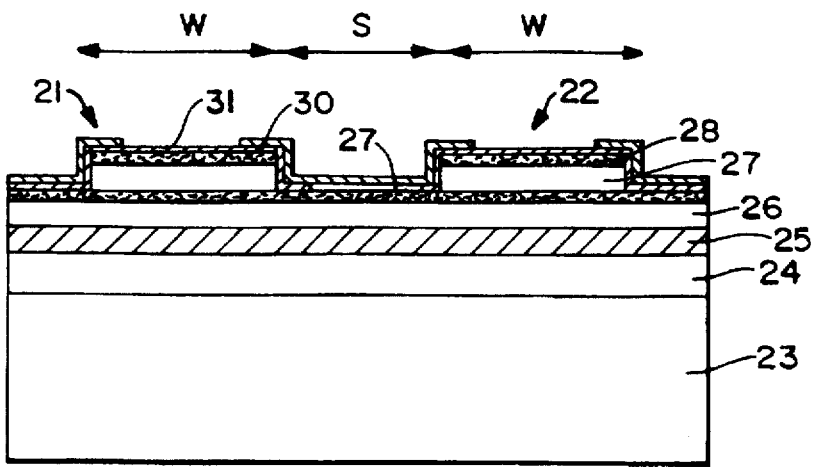

All the examples so far described are based on the use of non-linearities occurring in the regime where changes in the carrier population results in cross-phase modulation of one signal e.g. the data signal, by another signal, e.g. a clock signal. However the present invention is not limited to operation in this regime, and may also be applied to semiconductor devices exploiting other non-linearities. In particular, the invention may be used with devices such as those described in our co-pending International application No. PCT/GB 93/01897 (BT Case A24475/WO). That application discloses and claims a non-linear active optical semiconductor device for use in data operations in optical communications systems, the device comprising:

(i) An active region to which an optical signal can be input in use;

(ii) Optical pump input means for inputting an optical pump to said active region, said optical pump comprising a wavelength shorter than a band gap equivalent wavelength of said active region; and (iii) Optical gain determining means for setting said active region at, or substantially at, transparency with respect to the optical pump;

the arrangement being such that, in use, the optical pump effects the refractive index of said active region in a non-linear fashion such that transmission of the optical signal in the device can be controlled. This device uses the above-band gap ultra fast optical non-linearity observed in active waveguides driven at the material transparency current. This non-linearity is reported the papers "Observations of ultra fast non-linear refraction in an in GaAsP optical amplifier" published in Applied Physics Letters volume 58 pages 1119–1121 (1991), R. S. Grant and W. Sibbett, and "Ultra fast refractive index dynamics in AlGaAs diode laser amplifiers", published in Applied Physics Letters volume 59 page 635 (1991) C. T. Hultgern and E. P. Ippen. A suitable device for exploiting this non-linearity is shown in FIG. 9. This shows, in plan view, a directional coupler 20 comprising a device with a pair of parallel ridge waveguides 21, 22. Referring to FIG. 9b, the construction of these waveguides can be seen in cross section, and has the following features:

(i) A substrate 23 of InP, ~100 µm thick, n-doped;
(ii) A buffer layer 24 of InP, 1.5 µm thick and doped to $n=2\times10^{18}$;
(iii) An undoped active/waveguide layer 25, of MQW construction and total thickness 0.4 µm;
(iv) A cladding layer 26 of InP, 0.2 µm thick and p-doped to $5\times10^{17}$;
(v) An etch stop layer 27 of GaInAsP, 0.03 µm thick and p-doped to $5\times10^{17}$;
(vi) A ridge 28 of each waveguide 21, 22, comprising InP, 1.0 µm thick and p-doped to $5\times10^{17}$;
(vii) A semiconductor contact layer 29 to each ridge 28, of GaInAs, 0.1 µm thick and p-doped to $10^{19}$;
(viii) An isolator layer 30 of silicon oxide;
(ix) A metal contact layer 31 of Ti/Au.

All doping levels are given in $cm^{-3}$.

These thicknesses and doping level quoted are for illustrative purposes only as a range of different parameters can give similar device properties.

The two ridges 28 of equal width W are separated by a distance S, formed by etching through the ridge and contact layers 28, 29 to form channels. The etch stop layer 27 is used to control the etch depth if a selective chemical etching process is used.

The active/waveguide layer 25 consists of 32 GaInAs wells, each 65 Å thick, together with 60 Å InP barrier layers.

In one example, the device is operated with an optical signal at a transmitted wave length of 1526.8 nm. The transparency current is then 12.6 mA at 15° C. When operated in accordance with the present invention, in addition to a first beam at the signal wavelength and a second optical pump at a second wavelength, a holding beam at a third wavelength is input to the device. As before, the effect of this holding beam is to pin the Fermi level. The holding beam may advantageously be used to hold the system at transparency thereby avoiding the need for precision feedback control of an electrical bias signal. The holding beam may be at the signal wavelength, or at a longer wavelength, e.g. 1528 nm in the present embodiment.

Although the above embodiments consider 3 wavelengths only, the technique allows for simultaneous cross-phase modulation on a large number of different "signal" ($\lambda_3$) wavelengths. This means the device may have applications for signal processing of wavelength-division multiplexed (WDM) signals. Also although in the embodiment the signals are pulse streams. This need not be so. A non-saturating continuous wave (cw) beam (or beams) at $\lambda_3$ will experience a phase/amplitude modulation from a pulsed stream at $\lambda_2$ as will the holding beam at $\lambda_1$. Frequency filtering techniques allow the fasn (ie modulated) portion of the beam(s) at $\lambda_3$ (s), and at $\lambda_1$ to be recovered, thereby allowing simultaneous wavelength conversion of a pulse (data or clock) stream to many different wavelengths.

REFERENCES

1. 'The use of GaInAsP amplifiers for 40 Gbit/s signal processing' A. D. Ellis, D. M. Spirit. Postdeadline Paper, Nonlinear Guided-Wave Phenomena, Cambridge, England Sep. 20–22, 1993.
2. 'A Terahertz Optical Asymmetric Demultiplexer (TOAD)' J. P. Sokoloff, P. R. Pruncal, I. Glesk, and M. Kane. IEEE Photonics Technology Letters, Vol 5, No.7, July 1993 pp 787–790.

We claim:

1. A non-linear optical phase switch comprising a semiconductor optical gain medium arranged to switch a signal at a first wavelength ($\lambda_3$) in response to a control signal ($\lambda_2$) at a second wavelength applied to the optical gain medium, where the gain medium has a refractive index modified in response to the control signal, and an optical holding signal at a third wavelength ($\lambda_1$) is applied to the gain medium to pump the semiconductor optical gain medium and control a Fermi level of the gain medium.

2. A switch according to claim 1, in which the holding signal is a continuous wave signal.

3. A switch according to claim 1, in which the holding signal is a pulsed signal timed to follow the control signal.

4. A switch according to claim 1, in which the semiconductor optical gain medium is a non-linear element of a non-linear loop mirror (NOLM).

5. An OTDM demultiplexer including a switch according to claim 1.

6. An optical pulse generator comprising:

a mode-locked laser having an optical cavity;

a non-linear optical phase switch connected in the optical cavity of the mode-locked laser, where the switch includes a semiconductor optical gain medium switching a signal at a first wavelength in response to a control signal at a second wavelength applied to the optical gain medium, the gain medium has a refractive index modified in response to the control signal, and an optical holding signal at a third wavelength applied to the gain medium to control a Fermi level of the gain medium, and the control signal is applied to gain medium cross-phase modulating pulses propagating in the cavity.

7. An optical pulse generator according to claim 6 in which the pulses propagating in the cavity are locked to a timing wave of a data stream applied to the gain medium as said control signal, thereby generating a recovered clock signal.

8. A wavelength converter comprising:

a non-linear optical phase switch including a semiconductor optical gain medium switching a signal at a first wavelength in response to a control signal at a second wavelength applied to the optical gain medium, where the gain medium has a refractive index changed by the control signal, and an optical holding signal at a third wavelength applied to the gain medium pumps the gain medium and fixes a Fermi level of the gain medium.

9. A method of switching an optical signal comprising the steps of:

a. directing an optical signal at a first wavelength through a semiconductor gain medium;

b. applying a control signal at a second wavelength to the gain medium to modify a refractive index of the gain medium;

c. applying an optical holding signal at a third wavelength to the gain medium to pump the medium.

10. A method according to claim 9, wherein in step (c) the holding signal is a continuous wave signal.

11. A method according to claim 9, wherein in step (c) the holding signal a pulsed signal timed to follow the control signal.

12. A method according to claim 9, further comprising the step of:

d. applying an electrical bias to the semiconductor gain medium to produce a gain in the holding beam sufficient to minimize attenuation of the holding signal as the holding signal passes through the gain medium.

13. A method according to claim 12 wherein in step (d) the electrical bias is greater than or equal to 200 mA.

14. A method according to claim 9, wherein in step (c) the holding beam has an optical power less than a saturation power of the gain medium.

15. A method according to claim 14 wherein in step (c) the optical power of the holding signal is in a range of 5 to 30 mW.

* * * * *